(12) United States Patent
Paek et al.

(10) Patent No.: US 8,937,378 B2
(45) Date of Patent: Jan. 20, 2015

(54) LEAD FRAME AND SEMICONDUCTOR PACKAGE INCLUDING THE SAME

(75) Inventors: Sung-kwan Paek, Changwon (KR); Se-chuel Park, Changwon (KR)

(73) Assignee: MDS Co., Ltd., Changwon-si (KR)

( * ) Notice: Subject to any disclaimer, the term of this patent is extended or adjusted under 35 U.S.C. 154(b) by 0 days.

(21) Appl. No.: 13/347,915

(22) Filed: Jan. 11, 2012

(65) Prior Publication Data

US 2012/0175758 A1 Jul. 12, 2012

(30) Foreign Application Priority Data

Jan. 11, 2011 (KR) .......................... 10-2011-0002890

(51) Int. Cl.
*H01L 23/495* (2006.01)
*H01L 23/00* (2006.01)

(52) U.S. Cl.
CPC .......... *H01L 23/49582* (2013.01); *H01L 24/32* (2013.01); *H01L 24/48* (2013.01); *H01L 24/29* (2013.01); *H01L 24/45* (2013.01); *H01L 2224/2919* (2013.01); *H01L 2224/32245* (2013.01); *H01L 2224/45147* (2013.01); *H01L 2224/48091* (2013.01); *H01L 2224/48247* (2013.01); *H01L 2224/73265* (2013.01); *H01L 2224/85439* (2013.01); *H01L 2224/85444* (2013.01); *H01L 2224/85464* (2013.01); *H01L 2224/92247* (2013.01); *H01L 2924/01029* (2013.01); *H01L 2924/01047* (2013.01); *H01L 2924/01079* (2013.01); *H01L 2924/01082* (2013.01); *H01L 2924/01088* (2013.01); *H01L 2924/014* (2013.01);

(Continued)

(58) Field of Classification Search
CPC .................................................. H01L 23/49582
USPC .................. 257/666, 677, E23.005, E23.006, 257/E23.017, E23.041, E23.053, E23.054, 257/676; 438/111, 123, 644, 646, 655, 671, 438/674

See application file for complete search history.

(56) References Cited

U.S. PATENT DOCUMENTS 5,994,767 A * 11/1999 Huang et al. ................... 257/666
6,197,615 B1 * 3/2001 Song et al. ..................... 438/111

(Continued)

FOREIGN PATENT DOCUMENTS

| KR | 10-2005-0097926 A | 10/2005 |
| KR | 10-2010-0050640 A | 5/2010 |
| KR | 10-2010-0103015 A | 9/2010 |
| WO | WO 2010104274 A2 * | 9/2010 |

*Primary Examiner* — Ermias Woldegeorgis
(74) *Attorney, Agent, or Firm* — Sughrue Mion, PLLC (57) ABSTRACT

A lead frame and a semiconductor package including the lead frame are provided. The lead frame includes: a base material; a first metal layer which is formed on at least one side of the base material, of which a surface is roughly formed, and which includes copper or nickel; a second metal layer which is formed on a surface of the first metal layer, of which a surface is roughly formed, and which includes palladium or a palladium alloy; a third metal layer which is formed on a surface of the second metal layer, of which a surface is roughly formed, and which includes gold or a gold alloy; and a fourth metal layer which is formed on a surface of the third metal layer, of which a surface is roughly formed, and which includes metal that includes silver.

1 Claim, 7 Drawing Sheets
(2 of 7 Drawing Sheet(s) Filed in Color)

(52) U.S. Cl.
CPC ............... *H01L 2924/01005* (2013.01); *H01L 2924/01006* (2013.01); *H01L 2924/01023* (2013.01); *H01L 2924/01033* (2013.01); *H01L 2924/01042* (2013.01); *H01L 2224/83385* (2013.01); *H01L 2924/01028* (2013.01)
USPC .... 257/676; 257/666; 257/677; 257/E23.006; 257/E23.041; 257/E23.017; 257/E23.053; 257/E23.054; 438/111; 438/123; 438/644; 438/646; 438/671; 438/674

(56) References Cited

U.S. PATENT DOCUMENTS

| | | | | |
|---|---|---|---|---|
| 6,245,448 | B1 * | 6/2001 | Abbott | 428/670 |
| 2004/0232534 | A1 * | 11/2004 | Seki et al. | 257/678 |
| 2007/0120233 | A1 * | 5/2007 | Tellkamp | 257/666 |
| 2011/0079887 | A1 * | 4/2011 | Shim et al. | 257/676 |
| 2011/0163345 | A1 * | 7/2011 | Fukunaga | 257/98 |
| 2012/0001307 | A1 * | 1/2012 | Cho et al. | 257/666 |

* cited by examiner

LEAD FRAME AND SEMICONDUCTOR PACKAGE INCLUDING THE SAME

CROSS-REFERENCE TO RELATED PATENT APPLICATION

This application claims priority from Korean Patent Application No. 10-2011-0002890 filed on Jan. 11, 2011 in the Korean Intellectual Property Office, the disclosure of which is incorporated herein in its entirety by reference.

BACKGROUND

1. Field

Apparatuses consistent with exemplary embodiments relate to a lead frame and a semiconductor package including the lead frame.

2. Description of the Related Art

A lead frame for a semiconductor package is a main component of the semiconductor package, together with a semiconductor die. The lead frame is used to support the semiconductor die and serves as a lead for connecting the semiconductor package to an external device.

Figure 1:
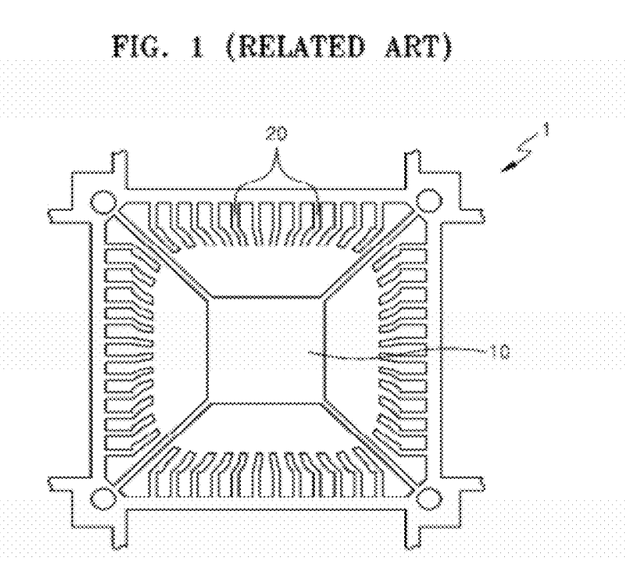
FIG. 1 is a schematic plane view of a general lead frame according to a related art.
Figure 2:
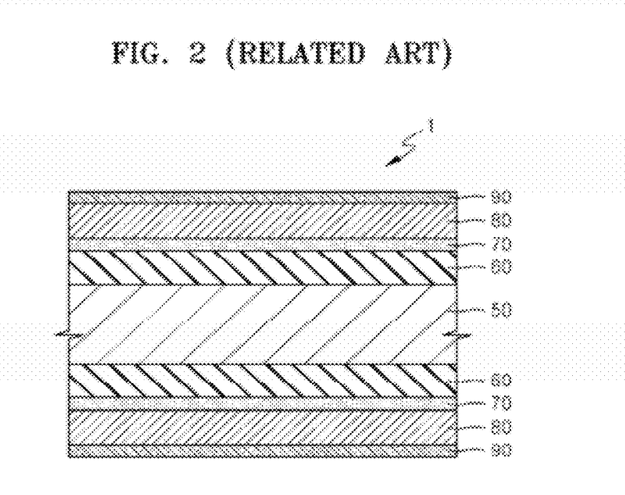
FIG. 2 is a schematic cross-sectional view of an example of a lead frame according to the related art.

FIG. 1 is a schematic plane view of a general lead frame 1, and FIG. 2 is a schematic cross-sectional view of an example of the general lead frame 1 according to the related art. Referring to FIG. 1, the general lead frame 1 includes a plurality of lead units 20 and a die pad unit 10. A semiconductor package is manufactured in such a way that a semiconductor die is attached to the die pad unit 10 of the general lead frame 1, and the semiconductor die and each of the lead units 20 are connected to each other via a wire, and then, are molded by using an epoxy molding compound (EMC), or the like.

Since these days lead (Pb) is not used in a semiconductor packaging process, a palladium pre-plated frame (PPF) type lead frame is widely used. However, a plated layer of the PPF has a hard material property, and thus, is not easily bonded to a bonding wire formed of copper (Cu). To solve this problem, gold (Au) having a relatively soft material property may be plated on a surface of the PPF. However, due to the price of gold (Au), cost thereof may increase.

Due to this problem of the PPF, the lead frame 1 in which a nickel layer 60, a palladium layer 70, a silver layer 80, and a gold layer 90 are sequentially plated with a base material 50 formed of Cu may be used, as illustrated in FIG. 2. The silver layer 80 of the lead frame 1 is formed relatively thick and has a soft material property and thus may be easily bonded to a Cu wire formed of a hard material.

However, when a semiconductor package, that is manufactured using the lead frame 1 of FIG. 2, is used in a high-temperature and humidity-absorbing environment, due to migration of silver atoms, a short between the lead units 20 or a short between the lead unit 20 and the die pad unit 10 occurs so that the lifespan and performance of the semiconductor package may be decreased.

Figure 3A:
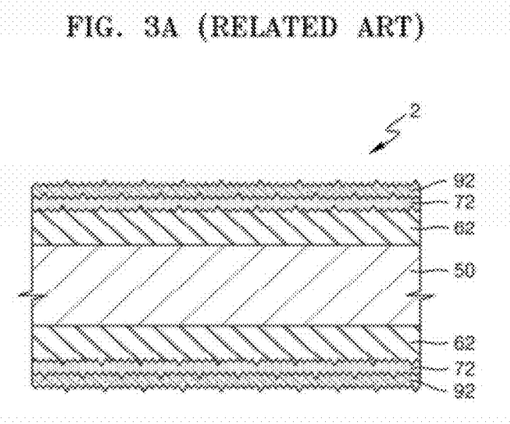
FIG. 3A is a schematic cross-sectional view of another example of a lead frame according to the related art.
Figure 3B:
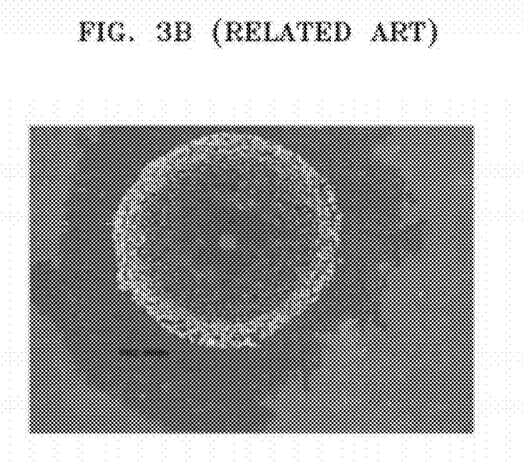
FIG. 3B is a photo showing epoxy bleeding that occurs in a die attaching process according to the related art.

FIG. 3A is a schematic cross-sectional view of another example of a lead frame 2 according to the related art, and FIG. 3B is a photo showing epoxy bleeding that occurs in a die attaching process.

In order to solve the problem, as illustrated in FIG. 3A, the lead frame 2 having roughness on its surface, on which a roughly-plated layer 62, a palladium layer 72, and a gold layer 92 are sequentially stacked on a base material 50 formed of Cu, may be used. The roughly-plated layer 62 may be formed by rapidly electroplating metal, such as nickel or Cu, by using a high current.

The lead frame 2 illustrated in FIG. 3A has roughness on its surface, and thus, has a large contact area with a Cu wire, Thus, the lead frame 2 has an excellent bonding property with respect to the Cu wire.

The lead frame 2 of FIG. 3A has an excellent bonding property with respect to the Cu wire but has an outermost layer formed of Au, and thus, a surface area of the outermost layer is large. Thus, bleeding of an epoxy adhesive may occur in a die attaching process. FIG. 3B illustrates a wire bonding region of the lead frame 2 of FIG. 3A. Referring to FIG. 3B, bleeding of the epoxy adhesive occurs widely in the wire bonding region of the lead frame 2.

Due to the bleeding of the epoxy adhesive, the lead frame 2 of FIG. 3A may lower the reliability of the semiconductor package in spite of having an excellent bonding property with respect to the Cu wire.

SUMMARY

One or more exemplary embodiments provide a lead frame that has an excellent bonding property with respect to a copper (Cu) wire, that may prevent bleeding of epoxy efficiently, and that may be manufactured at a low cost.

One or more exemplary embodiments also provide a semiconductor package including the lead frame that has high reliability and that may be manufactured at a low cost.

According to an aspect of an exemplary embodiment, there is provided a lead frame including: a base material; a first metal layer which is formed on at least one side of the base material, of which a surface is roughly formed, and which includes copper or nickel; a second metal layer which is formed on a surface of the first metal layer, of which a surface is roughly formed, and which includes palladium or a palladium alloy; a third metal layer which is formed on a surface of the second metal layer, of which a surface is roughly formed, and which includes gold or a gold alloy; and a fourth metal layer which is formed on a surface of the third metal layer, of which a surface is roughly formed, and which includes metal that includes silver, wherein the first metal layer includes: a seed layer of which a surface is roughly formed; and a protection layer which is formed on the surface of the seed layer and includes the same material as a material for forming the seed layer.

According to an aspect of another exemplary embodiment, there is provided a lead frame including: a base material; a first metal layer which is formed on at least one side of the base material, of which a surface is roughly formed, and which includes copper or a copper alloy; a second metal layer which is formed on a surface of the first metal layer, of which a surface is roughly formed, and which includes nickel or a nickel alloy; a third metal layer which is formed on a surface of the second metal layer, of which a surface is roughly formed, and which includes palladium or a palladium alloy; a fourth metal layer which is formed on a surface of the third metal layer, of which a surface is roughly formed, and which includes gold or a gold alloy; and a fifth metal layer which is formed on a surface of the fourth metal layer, of which a surface is roughly formed, and which includes metal that includes silver.

According to an aspect of another exemplary embodiment, there is provided a lead frame including: a base material of which a surface is roughly formed; a first metal layer which is formed on at least one side of the base material; a second metal layer which is formed on a surface of the first metal layer, of which a surface is roughly formed, and which includes palladium or a palladium alloy; a third metal layer which is formed on a surface of the second metal layer, of which a surface is roughly formed, and which includes gold or a gold alloy; and a fourth metal layer which is formed on a surface of the third metal layer, of which a surface is roughly formed, and which includes metal that includes silver.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and other aspects will become more apparent by describing in detail exemplary embodiments with reference to the attached drawings, in which.

DETAILED DESCRIPTION OF THE EXEMPLARY EMBODIMENTS

The inventive concept will now be described more fully with reference to the accompanying drawings, in which exemplary embodiments are shown.

Figure 4:
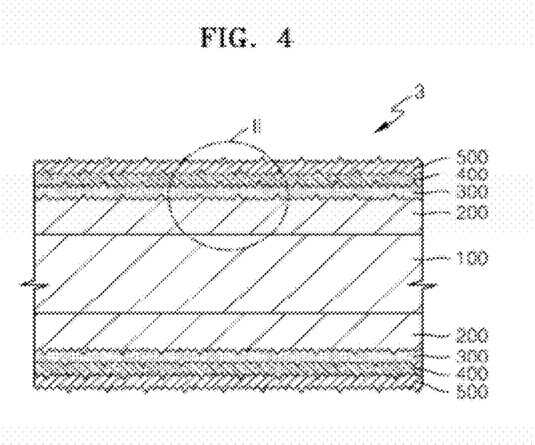
FIG. 4 is a schematic cross-sectional view of a portion of a lead frame according to an exemplary embodiment.
Figure 5:
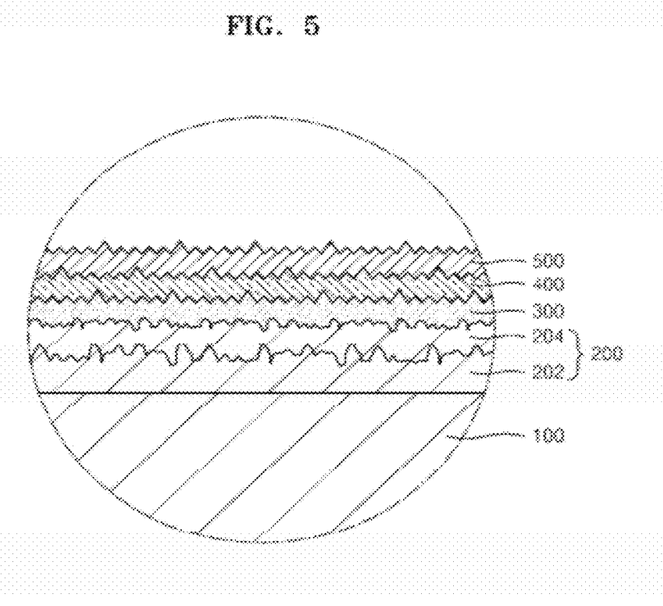
FIG. 5 is a schematic enlarged view of portion II of FIG. 4, according to an exemplary embodiment.
Figure 6:
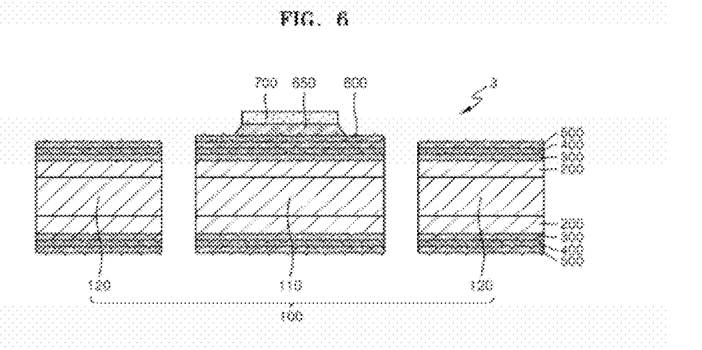
FIG. 6 is a schematic cross-sectional view of the lead frame illustrated in FIG. 4, according to an exemplary embodiment.

FIG. 4 is a schematic cross-sectional view of a portion of a lead frame 3 according to an exemplary embodiment, FIG. 5 is a schematic enlarged view of portion II of FIG. 4, according to an exemplary embodiment, and FIG. 6 is a schematic cross-sectional view of the lead frame 3 illustrated in FIG. 4, according to an exemplary embodiment.

Referring to FIGS. 4 through 6, the lead frame 3 according to the current embodiment includes a base material 100, a first metal layer 200, a second metal layer 300, a third metal layer 400, and a fourth metal layer 500.

The base material 100 on which the first through fourth metal layers 200, 300, 400, and 500 are plated includes a die pad unit 110 and a plurality of lead units 120 which have a planar shape, as illustrated in FIG. 1. The base material 100 may be formed of copper (Cu) or a copper alloy.

The first metal layer 200 is formed on the surface of the base material 100, and has a rough surface. The first metal layer 200 may be formed of nickel, a nickel alloy, or a copper alloy, and the thickness of the first metal layer 200 may be approximately 0.1 to 10 µm. The first metal layer 200 may be formed by electroplating the base material 100 in a metal ion chemical bath within a short time and by applying a high electric current.

The first metal layer 200 may be formed of nickel. The first metal layer 200 formed of nickel may be formed using a method disclosed in Korean Patent No. 10-0819200 filed by the present applicant.

The first metal layer 200 may also be formed of copper, which will now be described.

Referring to FIG. 5, the first metal layer 200 includes a seed layer 202, of which a surface is roughly formed, and a protection layer 204 that covers the seed layer 202.

The seed layer 202 is formed by electroplating in a copper sulfate solution, and is rapidly grown at a high current density more than 15 A/dm$^2$ (ASD) for 5 to 20 seconds. Nodules are formed under the high electric current density, and thus, the seed layer 202 may have a rough surface.

Hereinafter, a method of forming the first metal layer 200 is described in more detail.

The copper sulfate solution that is used for forming the seed layer 202 includes sulfuric acid ($CuSO_4$) and copper sulfate pentahydrate ($CuSO_4.5H_2O$). The concentration of sulfuric acid ($CuSO_4$) and the concentration of copper sulfate pentahydrate ($CuSO_4.5H_2O$) included in the copper sulfate solution may be 10 g/l to 30 g/l, respectively.

If the concentration of copper sulfate pentahydrate ($CuSO_4.5H_2O$) is less than 10 g/l, copper sulfate ions are insufficient, and an electroplating process time of the seed layer 202 increases, and thus, a current density needs to be increased. In this case, the growth of the seed layer 202 is unstable, so that a bonding property of the seed layer 202 with respect to the base material 100 may be lowered. On the other hand, if the concentration of $CuSO_4.5H_2O$ is greater than 30 g/l, the seed layer 202 is excessively grown, so that smut may be generated. The smut may cause a peeling phenomenon in which the seed layer 202 peels off from the base material 100 or the surface of the seed layer 202 peels off. In addition, if the concentration of copper sulfate pentahydrate ($CuSO_4.5H_2O$) is greater than 30 g/l, the rough seed layer 202 may be excessively grown, so that a burr may be formed on the seed layer 202. Thus, the concentration of $CuSO_4.5H_2O$ may be 10 g/l to 30 g/l.

The concentration of sulfuric acid ($CuSO_4$) may be 20 ml/l to 60 ml/1. If the concentration of sulfuric acid ($CuSO_4$) is less than 20 ml/1, conductive salt contained in the copper sulfate solution is insufficient, and a portion of the seed layer 202 on which current is concentrated may burn and change into black. Such a seed layer 202 does not have a required surface roughness, and the conductivity of the seed layer 202 may be reduced. Meanwhile, if the concentration of sulfuric acid ($CuSO_4$) is greater than 60 ml/l, conductive salt is excessively distributed in the copper sulfate solution and a plated layer is polished, and thus, the seed layer 202 having a predetermined roughness may not be easily formed. Thus, the concentration of sulfuric acid ($CuSO_4$) may be 20 ml/l to 60 ml/l.

A process time when the seed layer 202 is formed by electroplating is 5 to 20 seconds, as described above. This is because, if the process time is less than 5 seconds, a bonding property of the seed layer 202 with respect to the base material 100 is lowered, and if the process time exceeds 20 seconds, peeling, whereby the surface of the seed layer 202 peels off, may occur.

The average surface roughness (Ra) of the seed layer 202 may be 0.1 to 0.5 μm.

If the average surface roughness (Ra) of the seed layer 202 is less than 0.1 micrometers, unevenness formed on the surface of the seed layer 202 is very small, so that surface unevenness of the protection layer 204 to be formed on the seed layer 202 and surface unevenness of the plated layer to be subsequently formed on the seed layer 202 are also reduced, and the interlocking effect between the plated layer and a molding material may be reduced. On the other hand, if the average surface roughness (Ra) of the seed layer 202 is greater than 0.5 micrometers, the seed layer 202 is unstable, so that a portion of the seed layer 202 may peel off or be eliminated. Thus, the average surface roughness (Ra) of the seed layer 202 may preferably be 0.1 to 0.5 μm.

The protection layer 204 may be formed on a surface of the seed layer 202, and may be formed using electroplating with a relatively lower electric current density and at a relatively lower speed than those of the seed layer 202. The protection layer 204 may be formed of various metals including Cu, nickel, palladium, silver, and gold, or an alloy material including the metals described above; in particular, the same metal as metal used for forming the seed layer 202. If the protection layer 204 is formed of the same metal as the seed layer 202, the protection layer 204 may be formed by plating continuously on the seed layer 202 in the same metal ion chemical bath at a high current density. For example, if the seed layer 202 formed of nickel is formed on the base material 100, the protection layer 204 may be formed by continuously plating nickel on the seed layer 202 formed of nickel at a low current density, and if the seed layer 202 formed of copper is formed on the base material 100, the protection layer 204 may be formed by continuously plating Cu at a low current density. In this way, if the protection layer 204 is formed of the same metal as the seed layer 202, a bonding force between the seed layer 202 and the protection layer 204 is excellent, and a process of manufacturing the lead frame 3 is simplified so that the first metal layer 200 may be quickly formed.

The thickness of the protection layer 204 may be 0.125 μm to 1.0 μm. If the thickness of the protection layer 204 is less than 0.125 μm, supplementation of an adhesive force of the seed layer 202 may be insufficient. On the other hand, if the thickness of the protection layer 204 exceeds 1.0 μm, the surface roughness of the protection layer 204 may be reduced. Thus, the thickness of the protection layer 204 may be 0.125 μm to 1.0 μm.

Since the protection layer 204 is formed to a small thickness on the surface of the seed layer 202, the surface roughness of the seed layer 202 may be reflected on a surface of the protection layer 204. That is, the surface roughness corresponding to the surface of the seed layer 202 is formed on the surface of the protection layer 204, and the surface roughness of the protection layer 204 may be approximately 0.1 to 0.5 μm, similar to the surface roughness of the seed layer 202.

The seed layer 202 is formed by being rapidly grown at a high current density. Thus, an adhesive force of the seed layer 202 with respect to a subject to be plated may be slightly lowered, or a portion of the seed layer 202 may fall off. However, in the current embodiment, since the protection layer 204 is formed on the surface of the seed layer 202 and supplements a portion of the seed layer 202 that is weakly adhered to the subject to be plated, the adhesive force of the seed layer 202 may be efficiently improved. Thus, the seed layer 202 may be stably fixed on a subject to be plated, i.e., the base material 100. Also, the protection layer 204 may prevent foreign substances from permeating into the seed layer 202.

Since an adhesive force of the seed layer 202 with respect to the first metal layer 200 is supplemented by the protection layer 204 in this way, the first metal layer 200 may be stably fixed on the base material 100. Also, the first metal layer 200 is more flexible than a plated layer formed from the base material 100 at one time although the first metal layer 200 and the plated layer formed at one time may have a similar surface roughness. Thus, the first metal layer 200 may improve a bonding force of a wire during a wire bonding process.

The second metal layer 300 is formed on the surface of the first metal layer 200, and roughness of the surface of the first metal layer 200 is reflected on the surface of the second metal layer 300, and thus, a surface of the second metal layer 300 is roughly formed. The second metal layer 300 may be formed by electroplating palladium or a palladium alloy, and the thickness of the second metal layer 300 may be approximately 0.1 μm to 3 μm in consideration of stability and surface roughness of the plated layer and the price of material that is used for forming the plated layer. If the second metal layer 300 is formed of a palladium alloy, metal that may be added to palladium may include gold, silver, nickel, copper, cobalt, molybdenum, and the like, and a total fraction of added metal may be within 40%.

The third metal layer 400 is formed on the surface of the second metal layer 300, and roughness of the surface of the second metal layer 300 is reflected on the surface of the third metal layer 400, and thus, the surface of the third metal layer 400 is roughly formed. The third metal layer 400 may be formed by electroplating gold or a gold alloy, and the thickness of the third metal layer 400 may be approximately 0.1 μm to 2 μm in consideration of stability and surface roughness of the plated layer and the price of material that is used for forming the plated layer. If the third metal layer 400 is formed of a gold alloy, metal that may be added to gold may include palladium, silver, nickel, copper, cobalt, molybdenum, and the like, and a total fraction of added metal may be within 40%.

The fourth metal layer 500 is formed on the surface of the third metal layer 400, and constitutes an outermost metal layer of the lead frame 3, and roughness of the surface of the third metal layer 400 is reflected on a surface of the fourth metal layer 500, and thus, the surface of the fourth metal layer 500 is roughly formed. The fourth metal layer 500 may be formed by electroplating a silver-containing material, i.e. a gold-silver alloy or a silver alloy, and the thickness of the fourth metal layer 500 may be approximately 0.05 μm to 2 μm in consideration of stability and surface roughness of the plated layer and the price of material that is used for forming the plated layer.

The fourth metal layer 500 is formed of metal that includes silver and has a relatively soft material property, and thus, a copper (Cu) wire formed of a soft material may be efficiently attached to the fourth metal layer 500. Also, the surface of the fourth metal layer 500 is formed to have a roughness, and a contact area between the fourth metal layer 500 and the Cu wire is large, so that a bonding force of the Cu wire may be further improved.

In addition, in the current embodiment, the fourth metal layer 500 may be formed to a small thickness of 0.05 μm to 2 μm so that diffusion of silver atoms may be efficiently reduced. If silver atoms are diffused, the lead units 120 that need to be insulated may be electrically connected to each other. In the lead frame 3 according to the current embodiment, insulation between the lead units 120 and the die pad unit 110 may be efficiently maintained.

Also, since the fourth metal layer 500 is formed to a small thickness, the fourth metal layer 500 may be easily destroyed by temperature and pressure applied during wire bonding, so that the Cu wire and the third metal layer 400 may be easily bonded to each other.

In addition, the outermost layer of the lead frame 1 illustrated in FIG. 2 is a gold (Au) layer, whereas the fourth metal layer 500 that is the outermost layer of the lead frame 3 according to the current embodiment includes silver, which is more active than gold. Thus, if the fourth metal layer 500 is coated with epoxy, a bleeding phenomenon of epoxy may be efficiently reduced.

In order to reduce the bleeding phenomenon of epoxy, a fraction of silver contained in the fourth metal layer 500 needs to be maintained. Thus, if the fourth metal layer 500 is formed of a silver alloy, a total fraction of added metal may not exceed 40%. Metal that may be added to a silver alloy to constitute the fourth metal layer 500 may include gold, palladium, nickel, copper, cobalt, molybdenum, and the like. Even if the fourth metal layer 500 is formed of a gold-silver alloy, the bleeding phenomenon of epoxy may be reduced, and the fourth metal layer 500 may have excellent ductility and corrosion resistance.

As described above, in the lead frame 3 according to the current embodiment, a bonding property of the bonding wire formed of Cu is excellent, and the bleeding phenomenon of epoxy during the die attaching process may be efficiently prevented. Also, the outermost plated layer is formed of material that includes silver so that the thickness of the gold plated layer may be reduced, and the amount of usage of expensive gold may be reduced. That is, a manufacturing cost of the lead frame 3 according to the current embodiment may be further reduced.

Referring to FIG. 6, an organic layer 600 may be coated on at least a portion of the surface of the fourth metal layer 500, for example, the die pad unit 110. The organic layer 600 is formed of an organic material and may prevent the bleeding phenomenon of epoxy during the die attaching process more efficiently.

Figure 7:
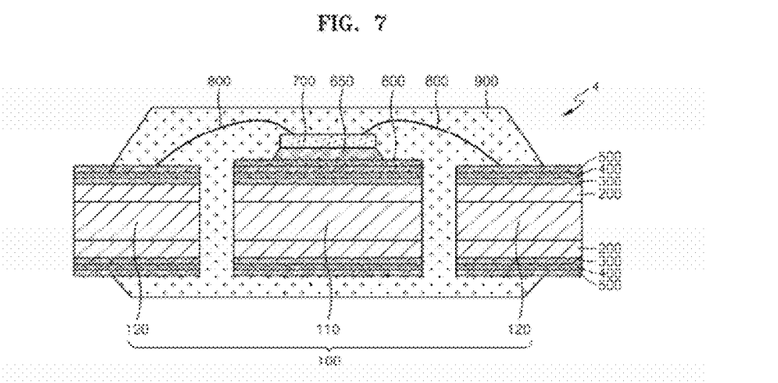
FIG. 7 is a schematic cross-sectional view of a semiconductor package including the lead frame of FIG. 4, according to an exemplary embodiment.

FIG. 7 is a schematic cross-sectional view of a semiconductor package 4 including the lead frame 3 of FIG. 4, according to an exemplary embodiment. Referring to FIG. 7, the semiconductor package 4 according to the current embodiment may be formed by attaching a semiconductor die 700 to the die pad unit 110 of the lead frame 3 illustrated in FIG. 6 with epoxy 650, and then, by electrically connecting the semiconductor die 700 and the lead unit 120 with a bonding wire 800 formed of Cu. The semiconductor die 700 and the bonding wire 800 may be sealed by a mold 900.

In the semiconductor package 4 according to the current embodiment, bleeding of the epoxy 650 when the semiconductor die 700 is attached to the lead frame 3 may be efficiently prevented, as described above, and a bonding force of the bonding wire 800 is large so that the semiconductor package 4 of FIG. 7 has high reliability.

In addition, due to roughness of the surface of the lead frame 3, a close-adhesion property of the lead frame 3 and the mold 900 may be excellent. Thus, separation of the lead frame 3 from an interface between the lead frame 3 and the mold 900 and permeation of foreign substances into the lead frame 3 may be efficiently prevented.

Next, a lead frame according to another exemplary embodiment and a semiconductor package including the lead frame is described.

Figure 8:
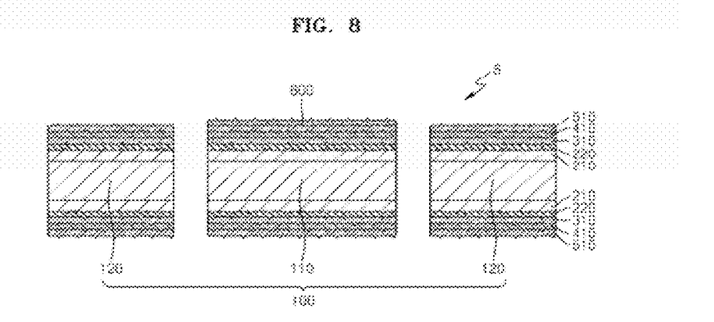
FIG. 8 is a schematic cross-sectional view of a lead frame according to another exemplary embodiment.
Figure 9:
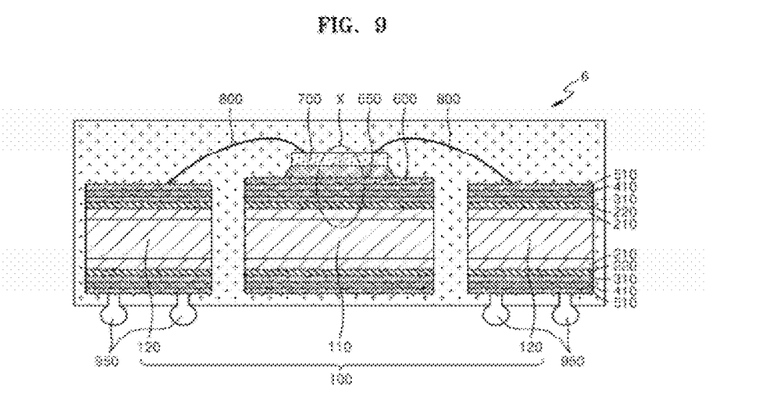
FIG. 9 is a schematic cross-sectional view of a semiconductor package including the lead frame of FIG. 8, according to an exemplary embodiment.
Figure 10:
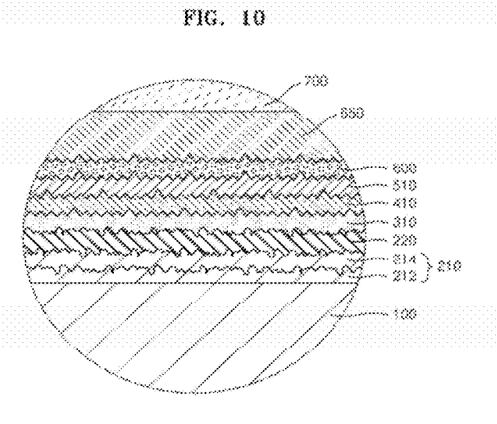
FIG. 10 is a schematic enlarged view of portion X of FIG. 9, according to an exemplary embodiment.

FIG. 8 is a schematic cross-sectional view of a lead frame 5 according to another exemplary embodiment, FIG. 9 is a schematic cross-sectional view of a semiconductor package 6 including the lead frame 5 of FIG. 8, according to an exemplary embodiment, and FIG. 10 is a schematic enlarged view of portion X of FIG. 9, according to an exemplary embodiment.

Referring to FIG. 8, the lead frame 5 according to the current embodiment includes a base material 100, a first metal layer 210, a second metal layer 220, a third metal layer 310, a fourth metal layer 410, and a fifth metal layer 510.

The first metal layer 210 is formed on at least one side of the base material 100, and has a rough surface. The first metal layer 210 may be formed of Cu or a Cu alloy, and is materially the same as the first metal layer 200 that is formed of Cu or a Cu alloy, of the lead frame 3 illustrated in FIGS. 4 through 6. The first metal layer 210 may include a seed layer 212 that is rapidly formed at a high current density and a protection layer 214 that is formed on the seed layer 212.

The second metal layer 220 is formed on a surface of the first metal layer 210, and is formed of nickel or a nickel alloy. The second metal layer 220 is formed by electroplating, and has surface roughness corresponding to roughness of the surface of the first metal layer 210. The second metal layer 220 may have an appropriate thickness in consideration of stability and surface roughness of the plated layer and the price of material that is used for forming the plated layer. For example, the thickness of the second metal layer 220 may be approximately 0.1 µm to 2 µm.

The third metal layer 310 is formed on a surface of the second metal layer 220, and is formed of palladium or a palladium alloy. The third metal layer 310 is formed by electroplating, and has surface roughness corresponding to roughness of the surface of the second metal layer 220. The third metal layer 310 may have an appropriate thickness in consideration of stability and surface roughness of the plated layer and the price of material that is used for forming the plated layer. For example, the thickness of the third metal layer 310 may be approximately 0.05 µm to 2 µm.

The fourth metal layer 410 is formed on a surface of the third metal layer 310 and is formed of gold or a gold alloy. The fourth metal layer 410 is formed by electroplating, and has surface roughness corresponding to roughness of the surface of the third metal layer 310. The fourth metal layer 410 may have an appropriate thickness in consideration of stability and surface roughness of the plated layer and the price of material that is used for forming the plated layer. For example, the thickness of the fourth metal layer 410 may be approximately 0.001 µm to 1 µm.

The fifth metal layer 510 is formed on a surface of the fourth metal layer 410, and is formed of metal that includes silver. For example, the fifth metal layer 510 may be formed of a gold-silver alloy or a silver alloy. The fifth metal layer 510 is formed by electroplating, and has surface roughness corresponding to roughness of the surface of the fourth metal layer 410. The fifth metal layer 510 may have an appropriate thickness in consideration of stability and surface roughness of the plated layer and the price of material that is used for forming the plated layer. For example, the thickness of the fifth metal layer 510 may be approximately 0.05 µm to 2 µm An organic layer 600 may be formed on at least a portion of the fifth metal layer 510, for example, the die pad unit 110.

In the lead frame 5 according to the current embodiment, like in the lead frame 3 illustrated in FIGS. 4 through 6, a bonding property of a bonding wire formed of Cu is excellent, and a bleeding phenomenon of epoxy may be reduced.

The lead frame 3 illustrated in FIGS. 4 through 6 and the lead frame 5 illustrated in FIGS. 8 through 10 may be used for manufacturing various types of semiconductor packages, such as a quad flat non-leaded (QFN) type semiconductor package, a ball grid array (BGA) type semiconductor package, and the like. That is, as illustrated in FIG. 9, the lead frame 5 illustrated in FIGS. 8 through 10, may also be used in the BGA type semiconductor package 6 including solder balls 950. Although not shown, the lead frame 3 illustrated in FIGS. 4 through 6 may also be included in the BGA type semiconductor package 6 including solder balls 950.

Next, a lead frame according to another exemplary embodiment is described.

Figure 11:
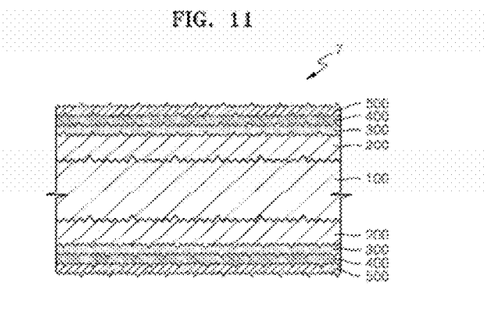
FIG. 11 is a schematic cross-sectional view of a lead frame according to another exemplary embodiment.

FIG. 11 is a schematic cross-sectional view of a lead frame 7 according to another exemplary embodiment.

Referring to FIG. 11, the lead frame 7 according to the current exemplary embodiment includes a base material 100, and first through fourth metal layers 200, 300, 400, and 500.

The surface of the base material 100 according to the current embodiment is roughly formed, unlike in the lead frame 3 illustrated in FIGS. 4 through 6 and the lead frame 5 illustrated in FIGS. 8 through 10. The surface roughness of the base material 100 may be approximately 0.1 to 0.5 μm, like in the first metal layer 200 illustrated in FIGS. 4 through 6 and the first metal layer 210 illustrated in FIGS. 8 through 10. The roughness of the surface of the base material 100 may be formed by using mechanical polishing or chemical etching.

The first through fourth metal layers 200, 300, 400, and 500 may be formed of nickel or a nickel alloy, palladium or a palladium alloy, gold or a gold alloy, and metal that includes silver, respectively, in the order that they are stacked on the base material 100. Each of the first through fourth metal layers 200, 300, 400, and 500 is electroplated to an appropriate thickness to have surface roughness corresponding to the surface roughness of a metal layer disposed under each of the first through fourth metal layers 200, 300, 400, and 500. The first metal layer 200 may also be formed of Cu or as a plated layer, instead of nickel or a nickel alloy.

In the lead frame 7 according to the current embodiment, since the surface of base material 100 is formed to have a roughness, the first metal layer 200 may be formed by general plating using a low electric current density.

In the lead frame 7 according to the current embodiment, since a metal layer that includes silver on a surface of the metal layer is disposed, and the surface of the metal layer is formed to have a roughness, like in the lead frame 3 illustrated in FIGS. 4 through 6 and the lead frame 5 illustrated in FIGS. 8 through 10, a bonding property of the bonding wire is excellent, and epoxy bleeding may be reduced.

Figure 12A:
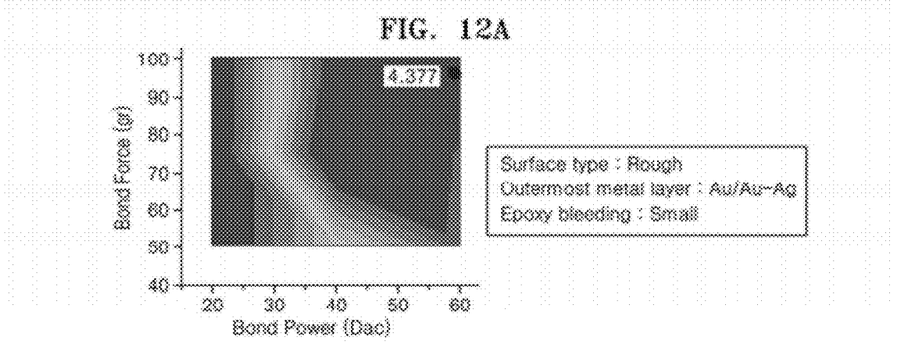
FIGS. 12A through 12C are graphs showing experimental results of an adhesive force of wires and a degree of bleeding of epoxy by varying a condition of an outermost layer of a lead frame, according to according to exemplary embodiments.
Figure 12B:
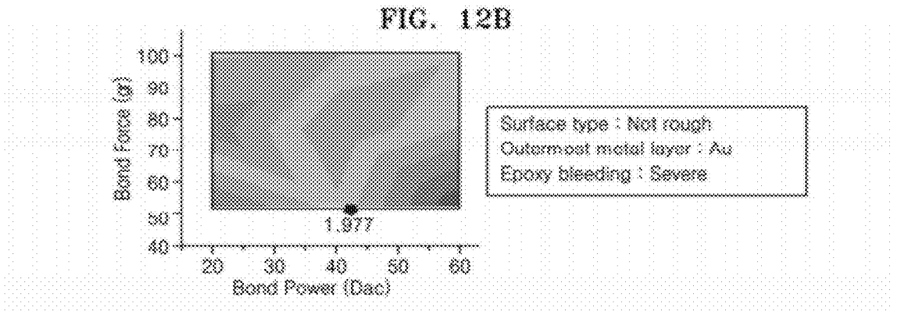
Figure 12C:
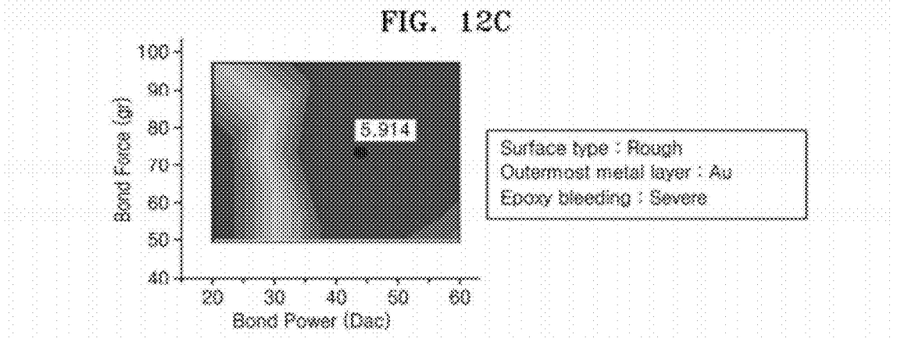

FIGS. 12A through 12C are graphs showing experimental results of a bonding pull test that was conducted as exemplary embodiments by varying a condition of an outermost layer of a lead frame. In addition, the bonding pull test and a test of a degree of bleeding of epoxy were simultaneously conducted. In each of the bonding pull test and the test of epoxy bleeding, a temperature was maintained at 180° C., and 680 specimens were used. In each test, the x-axis represents a value corresponding to the amount of ultrasonic vibration energy applied during wire bonding, and the y-axis represents a value corresponding to the amount of pressure applied during wire bonding. In each graph, as red color is saturated, a bonding force of a wire increases, and a dot indicated on each graph represents a bonding force of the wire that is measured under a condition in which the bonding force of the wire is a maximum.

FIG. 12A illustrates experimental results of a lead frame which includes an outermost layer formed as a gold layer and a gold-silver alloy layer disposed on the gold layer and of which a surface is roughly formed, i.e., the lead frame according to one of the above-described embodiments. As shown in FIG. 12A, the bonding force of the wire is excellent. In addition, the degree of bleeding of epoxy is very small. Thus, the lead frame is very appropriate for manufacturing a semiconductor package.

FIG. 12B illustrates experimental results of a lead frame which includes an outermost layer formed as a gold layer and on which surface-roughening is not performed and FIG. 12C illustrates experimental results of a lead frame which includes an outermost layer formed as a gold layer and on which surface-roughening is performed. Referring to FIG. 12B, the lead frame which includes an outermost layer formed as a gold layer and on which surface-roughening is not performed has a weak bonding force and a severe degree of bleeding. In addition, referring to FIG. 12C, the lead frame which includes an outermost layer formed as a gold layer and on which surface-roughening is performed has a strong bonding force but has a severe degree of bleeding.

That is, in the lead frame according to the one or more embodiments, the bonding force of the wire is very excellent and the degree of bleeding of epoxy is small compared to those of a general lead frame.

Although the lead frame and the semiconductor package according to the one or more embodiments have been described above, aspects of the inventive concept are not limited thereto, and the inventive concept may be embodied in various shapes.

For example, in the lead frame 3 illustrated in FIGS. 4 through 6, the seed layer 202 is formed at a high current density so as to form the first metal layer 200, and the protection layer 204 is grown on the seed layer 202. However, the first metal layer 200 may be formed while being continuously plated at a high current density at one time without forming the protection layer 204. That is, the first metal layer 200 may have a single layer in which the seed layer 202 and the protection layer 204 are not stacked but are formed as a one layer.

In addition, although in the drawings, a plurality of metal layers are formed on both sides of the base material 100, the plurality of metal layers may be also formed only on one side of the base material 100.

Otherwise, the inventive concept may be embodied in various shapes.

A lead frame according to the one or more embodiments has an excellent bonding property with respect to a Cu wire, may prevent a bleeding phenomenon of epoxy efficiently, and may reduce a manufacturing cost efficiently.

In addition, a semiconductor package according to the one or more embodiments includes the lead frame, and thus has high reliability and may reduce a manufacturing cost efficiently.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:
1. A semiconductor package comprising:
    a lead frame comprising:
        a base material;
        a first metal layer which is formed on at least one side of the base material, of which a surface is roughly formed, and which comprises nickel;
        a second metal layer which is formed on a surface of the first metal layer, of which a surface is roughly formed, and which comprises palladium or a palladium alloy;

a third metal layer which is formed on a surface of the second metal layer, of which a surface is roughly formed, and which comprises gold or a gold alloy; and a fourth metal layer which is formed on a surface of the third metal layer, of which a surface is roughly formed, and which comprises metal comprising a gold-silver alloy a semiconductor die attached to the lead frame;

epoxy attaching the semiconductor die to the lead frame; and an organic layer disposed between the epoxy and the fourth metal layer, wherein the first metal layer comprises:
  a seed layer of which a surface is roughly formed; and
  a protection layer which is formed on the surface of the seed layer and comprises nickel which is the same material as a material for forming the seed layer.

* * * * *